United States Patent [19]

Balaban et al.

[11] Patent Number: 5,050,609

[45] Date of Patent: Sep. 24, 1991

[54] MAGNETIZATION TRANSFER CONTRAST AND PROTON RELAXATION AND USE THEREOF IN MAGNETIC RESONANCE IMAGING

[75] Inventors: Robert S. Balaban, Bethesda, Md.; Steven D. Wolff, Durham, N.C.

[73] Assignee: The United States of America as represented by the Department of Health and Human Services, Washington, D.C.

[21] Appl. No.: 337,980

[22] Filed: Apr. 14, 1989

Related U.S. Application Data

[63] Continuation-in-part of Ser. No. 109,242, Oct. 4, 1988, abandoned.

[51] Int. Cl.⁵ ............................................. A61B 5/05
[52] U.S. Cl. ............................................. 128/653 CA
[58] Field of Search ................. 128/653 CA; 600/1-4; 424/9

[56] References Cited

PUBLICATIONS

Zubay, Geoffrey, *Biochemistry*, Addison-Wesley Publishing Company, pp. 131-141, 1983.
David G. Gadian, Nuclear Magnetic Resonance and its Application to Living Systems, pp. 16-20, 23-24, 63-65, 1982.
Forsen et al., Journal of Chemical Physics, vol. 39(11), pp. 2892-2901 (1963).
Brown et al., Proc. Natl. Acad. Sci, 74(9), pp. 3627-3631 (1977).
Bitt et al., Journal of Biological Chemistry, 260(6), pp. 3512-3517 (1984).

*Primary Examiner*—John D. Yasko
*Assistant Examiner*—Sharon Rose
*Attorney, Agent, or Firm*—John E. Tarcza

[57] ABSTRACT

A nuclear magnetic resonance method is provided for monitoring and imaging the exchange of magnetization between protons in free water and protons in a relatively immobilized pool of protons in a sample. The method provides a new form of contrast for nuclear magnetic resonance imaging of samples such as biological tissues, polymers, and geological samples.

30 Claims, 4 Drawing Sheets

MAGNETIZATION TRANSFER CONTRAST AND PROTON RELAXATION AND USE THEREOF IN MAGNETIC RESONANCE IMAGING

The present application is a continuation-in-part of application Ser. No. 07/109,242, now abandoned filed Oct. 14, 1988, the contents of which are incorporated herein by reference.

FIELD OF THE INVENTION

The present invention relates to a quantitative form of contrast for nuclear magnetic resonance imaging.

BACKGROUND OF THE INVENTION

Nuclear Magnetic Resonance, or NMR, has been used for many years as a means of chemical analysis. NMR is a type of radio frequency spectroscopy which is based upon small energy differences between electrically charged atomic nuclei which are spinning parallel or antiparallel to an applied magnetic field. When radiofrequency energy is applied to the sample, these spinning atomic nuclei change spin states and, in doing so, absorb some of the radiofrequency energy. Nuclei in slightly different chemical environments within the same molecule change spin state at slightly different energies, and this produces the characteristic absorption or resonances which help identify the molecular structure.

NMR has more recently been used for spectroscopy and imaging examinations of the human body, and in this form is now often called MRI (Magnetic Resonance Imaging). Other methods, such as computerized axial tomography (CAT scanning), have been used in the past for this purpose, and still are. However, because NMR does not use ionizing radiation, it is believed to have some safety advantages over CAT scanning. In addition, NMR can detect chemical information whereas other techniques of imaging, such as ultrasound and X-rays, can only detect differences in the density of materials, Thus, NMR is an advantageous method for producing cross-sectional images of the human body.

Historically, nuclear magnetic resonance has been used for ex vivo studies of cells or tissues, or for in vivo observation of a living body. Generally, information can be obtained from the whole body or from a specified area of the body beneath the skin surface by application of a nuclear resonance phenomenon.

In one such method, described in Abe, U.S. Pat. No. 4,240,439, a method is provided for endoscopy of a specified area of a living body for obtaining high-resolution information on liquids such as intracellular or extracellular fluid, tumors such as benign or malignant tumors, inflammatory tissues, etc., through the medium of an NMR signal of a nuclear magnetic substance such as a proton, fluorine, magnesium, phosphorus, sodium, calcium, or the like, in an organ close to the surface of the skin, such as a mammary gland or the thyroid gland, a tubular or cavitary organ such as the uterus, an intestine, or the throat, or an organ incised by a surgical operation.

In traditional methods of studying pathology of organs, an abnormality of the organ target area is recognized merely as a shadow, and the qualitative judgement as to whether the abnormality is benign or malignant is finally made after a histomorphological examination. The same may be said of ultrasound measurements.

The method of obtaining internal information of a target body from the outside thereof by the application of nuclear magnetic resonance techniques has a great advantage as a non-invasive method. NMR images contain chemical information in addition to morphological information, which can provide physiologic information.

The relaxation properties of water $^1H$ nuclei are the basis for most of the contrast obtained by NMR imaging techniques. Conventional $^1$NMR images of biological tissues usually reflect a combination of spin-lattice ($T_1$) and spin-spin ($T_2$) water $^1H$ relaxation. The variations in water $^1H$ relaxation rate generate image contrast between different tissues and pathologies depending on how the NMR image is collected. The precise nature of the relaxation process in tissues is still an active area of research. It has been proposed that a predominant relaxation mechanism in biological tissues is cross-relaxation and/or chemical exchange between $^1H$ in "free" or highly mobile water and $^1H$ associated with macromolecules or immobile water (cf. Edzes et al., Nature (London) 265: 521 (1977); Edzes et al., J. Magn. Res. 31:207 (1978); Sobol et al., Biophys. J. 50: 181 (1986); Koenig, in Water in Polymers, Rowand, SP (ed), American Chemical Society, Washington, D.C. (1980), p. 157; Koenig et al. in NMR Spectroscopy of Cells and Organisms Vol. 2, R. K. Gupta (ed) CRC Press, Inc. Boca Raton, Fla. p. 75 (1987). These conclusions were based on detailed studies of the effect of static magnetic field strength as well as selective and non-selective excitation pulses on water $^1H$ relaxation rates.

Understanding water $^1H$ magnetization relaxation and exchange in biological tissues is important in the evaluation of the "state" of water in tissues as well as in the interpretation of NMR images for clinical studies.

Current technology possesses the technique of saturation transfer for both 31P and $^1H$ NMR, but all studies to date have been one dimensional. $^1H$ NMR imaging (MRI) is a technique that has been available for years, but images to date have all relied upon differences in $T_1$, $T_2$, or proton density for information about the sample being studied. These techniques, saturation transfer and NMR imaging, have never before been combined to permit the imaging of chemical exchange rates and proton metabolite concentrations.

SUMMARY OF THE INVENTION

It is an object of the present invention to provide for improved NMR imaging.

Another object of the present invention to provide an improved system for carrying out certain medical diagnosis.

Yet another object of the present invention is to provide a nuclear magnetic resonance method for monitoring and imaging the exchange of magnetization between free protons and a relatively immobilized pool of protons in a sample.

It is still another object of the present invention to provide a new form of contrast for nuclear magnetic resonsance imaging of samples.

It is a further object of the present invention to measure directly and image the magnetization exchange between protons and a broad immobilized proton pool a sample.

It is yet a further object of the present invention to use magnetization transfer to monitor the chemical exchange rates of reactions.

It is yet another object of the present invention to provide a new form of contrast for nuclear magnetic resonance imaging of biological tissue, geological samples, and polymers.

The process of the present invention relies on the exchange of magnetization between the free protons (~0.1 ppm linewidth) observed in the conventional NMR experiment with a broad component (~50 ppm) pool of protons. This broad component can comprise immobilized water or other solvent, or protons exchanging directly off of macromolecules. The present process is based on the observation of this exchange using saturation transfer techniques.

According to the present invention, NMR data are collected from a sample in order to gain spatial information about the rate of exchange of the reaction using the technique of saturation transfer. A first pool of nuclei is excited with radiofrequency sufficient to label this first pool of nuclei with electromagnetic radiation. This is generally in the range of about 9 watts of radiofrequency power. Then a second pool of nuclei is electromagnetically excited, this second pool of nuclei being in exchange with the first pool of nuclei. Magnetic field gradients are then applied to spatially resolve the NMR signal intensity of the second pool of nuclei. The data are then collected, and an image is generated.

A ratio image can be obtained by averaging the image from this saturation transfer method with a conventional NMR image. This ratio image is particularly useful in providing enhanced images of reaction rates in biological tissues.

By irradiating the broad component with radiofrequency power sufficient to label the nuclei of the broad component, a specific transfer of magnetization occurs to the "free" nuclei resonance. This results in a decrease in the steady state magnetization as well as a measurable decrease in the spin lattice relaxation time of the nuclei.

According to the present invention, images of the "free" component are collected without irradiation of the broad component, and with irradiation of the broad component. The difference in the two images is then used to evaluate the distribution of the exchange between the "free" component and the broad component.

These images demonstrate that the distribution of this exchange can be obtained using the saturation transfer technique and that different components possess different exchange characteristics which result in intensity contrast in the NMR image. This contrast is generated using the changes in steady state magnetization or by the change in $T_1$ induced by the irradiation of the broad component.

The process of the present invention can be used to monitor reactions in a great variety of samples, the only requirement being that there be a first pool of nuclei which can be electromagnetically excited and a second pool of nuclei which is in exchange With the first pool of nuclei. In general, the first pool of nuclei is in much smaller concentration than the second pool of nuclei, generally by a factor of at least about 100. The reaction can take place in any solvent which has nuclei which can be excited, such as water, ethanol, and the like.

Among the nuclei that can be subjected to excitation are $^1H$, $^{31}P$, $^{13}C$, $^{23}Na$, $^{19}F$, $^2H$, $^{17}O$, $^{15}O$, $^7Li$, $^{14}N$, $^{15}N$, $^{39}K$, and $^{35}Cl$.

The technique of the present invention can be used to determine reaction rates in a great variety of systems. This method can be used to enhance the NMR contrast for biological systems, as well as for geological samples such as soil samples and petroleum samples, and for polymers.

Exchange between metabolites and water as well as water-water exchange can thus be imaged using magnetization transfer techniques. In vivo, this exchange process is dominated by the interaction of water with a very broad component in the NMR spectrum (~30,000 Hz). This could be due to exchange of water with a broad component associated with protein or lipid structures with a rate constant on the order to 1 sec-1.

The contrast magnetization transfer of the present invention can be used in imaging different tissues under conditions where the interaction of water with the protein and lipid matrix may be disrupted, such as in edema or in some forms of cancer.

For example, mM concentrations of urea and ammonia in water phantoms can be ratio imaged by irradiating the urea or ammonia resonances and observing the effect on the large (100M) proton resonance. This method results in an enormous gain in the detection of metabolites such as urea and ammonia, since the effect on the water peak is much larger than the magnitude of the metabolites alone.

The exchange between $^1H$ magnetization in "free" water ($^1H_f$) and in a pool with restricted motion ($^1H_r$) is observed in tissues in vivo using NMR saturation transfer methods. Exchange between these two pools is demonstrated by a decrease in the steady state magnetization and relaxation times of $^1H_f$ with radio-frequency irradiation of $^1H_r$. The pseudo first order rate constant for the movement of magnetization from $^1H_f$ to $^1H_r$ was $\sim 1$ s$^{-1}$ in kidney and $\sim 3$ s$^{-1}$ in skeletal muscle in vivo. Proton NMR imaging demonstrates that this exchange was tissue specific and generated a novel form of NMR image contrast. The extent of exchange between $^1H_f$ and $^1H_r$ as well as the topological correlation of the exchange with relaxation weighted images suggests that this pathway is a major determinant of the observed relaxation properties of water $^1H$ in vivo.

DETAILED DESCRIPTION OF THE INVENTION

According to the present invention, the magnetization exchange between nuclei in a first pool of nuclei and nuclei in a second pool of nuclei immobilized in a sample is compared. The magnitude and ubiquitous nature of this exchange suggests that this process is the major method of a magnetization relaxation of nuclei in a sample, resulting in a greater contrast of images obtained using conventional proton NMR imaging techniques.

The process of the present invention is particularly useful for monitoring the magnetization process in intact tissues, which is particularly useful in diagnostic imaging.

The process of the present invention can be used in ratio imaging mM concentrations of components in sample by irradiating the compounds of interest and observing the effect on the large (110M) nuclei resonance. It was found that the magnitude of the nuclei magnetization transfer is different in different samples, resulting in excellent image contrast based on this exchange process.

To detect magnetization exchange with $^1H$ water, spins in exchange with water are selectively irradiated, and the effect on the intensity and $T_1$ of water $^1H$ is observed. Images of this exchange can be obtained as either ratio images, collected with and without irradiation, or by imaging the $T_1$ effects of the irradiation with a $T_1$ sensitive imaging sequence.

All experiments were performed using General Electric CSI spectrometers operating at 4.7 or 2.0 Tesla. The rabbit kidnoY and skeletal muscle preparations were used as described in Hsieh et al.., *J. Magn. Res.* 74: 574 (1987); Hsieh et al., *Magn. Res. Med.* 7: 56 (1988); and Wolff et al., *J. Magn. Res.* 75: 190 (1987). Coil designes for these studies were also previously described for the rabbit leg and kidney in vivo, in the above.

Figure 1A:
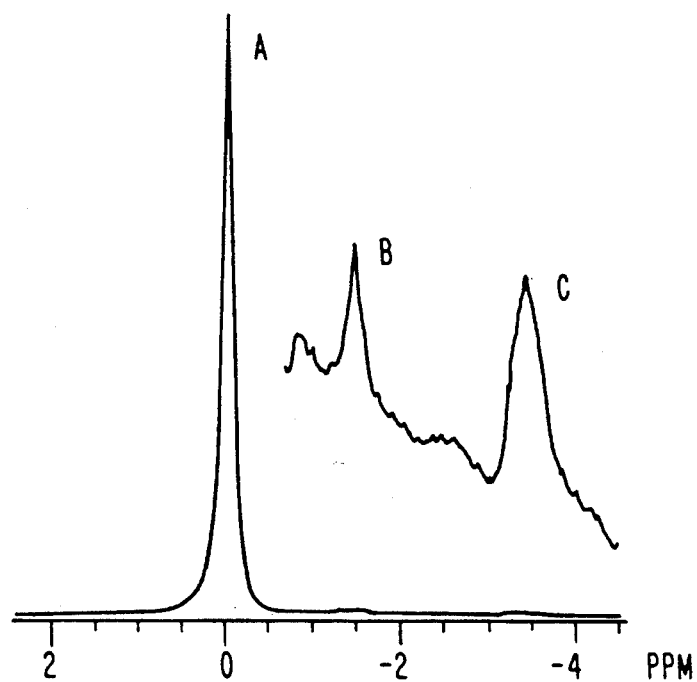
FIGS. 1A and 1B show the effect of preirradiation on $^1H$ NMR detected metabolites and water of rabbit kidney in vivo.
Figure 1B:
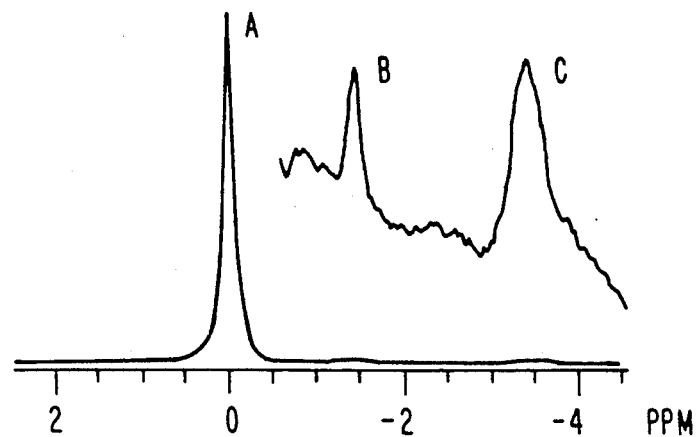

Saturation transfer experiments were performed by irradiating the immobilized $^1H$ pool and observing the effect on the steady state magnetization as well as the observed spin-lattice relaxation ($T_1$) time of $^1H_f$. It was assumed that radio-frequency irradiation $\geq 5$ kHz from the $^1H_f$ resonance would result in a selective irradiation of $^1H_r$, since $^1H_r$ would have an NMR linewidth much greater than $^1H_f$ (i.e., the $T_2$ relaxation time should be shorter for $^1H_r$). Saturation transfer experiments were conducted by pre-irradiating at frequencies selected within 200 kHz of the Larmor frequency of the $^1H_f$ resonance. FIG. 1 shows the effect of irradiation at a frequency 10 kHz lower than the $^1H_f$ resonance of a rabbit kidney in vivo. The preirradiation resulted in a specific 30% decrease in the magnitude of the water resonance (measured as the area of the resonance peak) that was not observed for the other $^1H$ signals from fats or trimethylamines even though the irradiation was closer in frequency to these metabolites. These effect was also reproduced in rabbit skeletal muscle and brain in vivo. These results are consistent with the presence of a specific magnetization exchange between $^1H_f$ and $^1H_r$ pools in these tissues.

In FIG. 1, the rabbit kidney preparation and NMR probe design were described in Wolff et al., op. cit. The animal's temperature was maintained at 37° C., Each spectrum resulted from 16 averages of a $\pi/2$-$\Gamma$-$\pi$-$\Gamma$-acquire sequence in which $\Gamma = 50$ ms. For this study, the magnetic field strength was 4.7 T. 1K complex points were collected with an acquisition time of 256 ms. A; Without preirradiation, interpulse delay was 6 seconds. B: With preirradiation (0.4 W, 10 kHz below the $^1H_f$ resonance frequency) during the last 4 seconds of the interpulse delay. Peak assignments are: A) water, B) trimethylamines, and C) lipids.

Figure 2A:
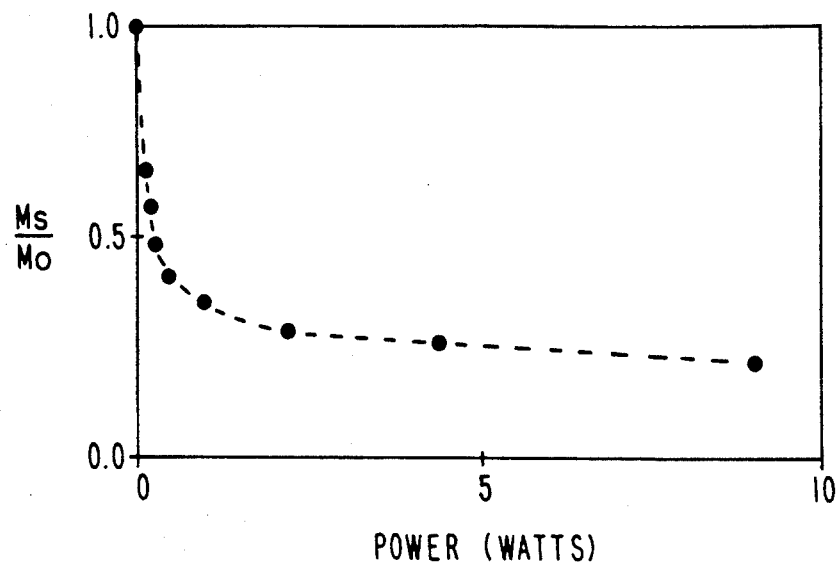
FIG. 2a shows the effect of preirradiation power on the magnitude of the water resonance of the rabbit kidney in vivo.

The decrease in $^1H_f$ signal by irradiation of $^1H_r$ was found to be power- and frequency-dependent. The effect of irradiation power on the steady state $^1H_f$ signal is shown in FIG. 2a. Using this curve, the maximum decrease in steady state $^1H_f$ magnetization obtained by irradiation $^1H_r$ was estimated to be 70% in the kidney in vivo. This irradiation power versus $^1H_f$ magnitude curve was obtained for all of the tissues and fluids studied in this investigation to assure that a maximum effect of irradiation was recorded at any given frequency.

In FIG. 2a, preparation was identical to that used in FIG. 1. The spectra were acquired from a $\pi/8$ pulse that followed a 6 second inter-pulse delay, where during the last four seconds there was rf preirradiation 5 kHz below the $^1H_f$ resonance frequency. The field strength was 4.7 T.

Figure 2B:
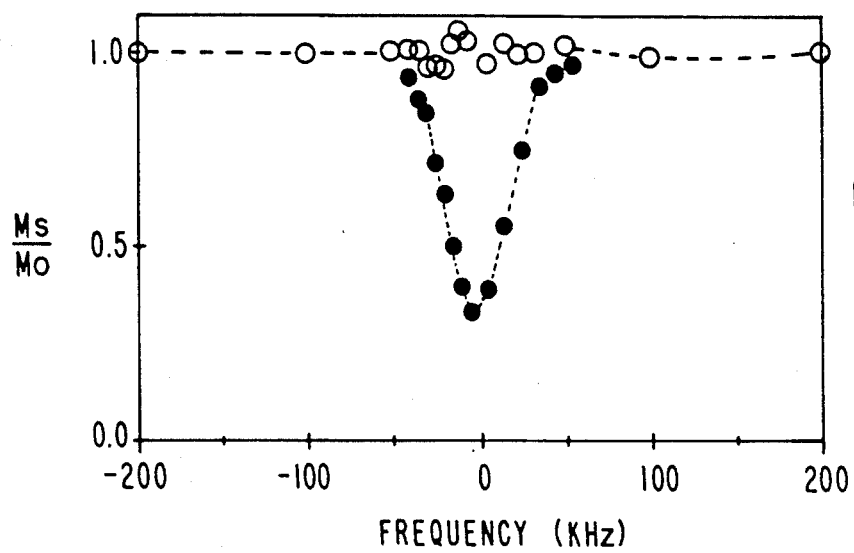
FIG. 2b shows the effect of preirradiation frequency on the magnitude of the $^1H_f$ resonance from rabbit kidney in vivo(.) and distilled water (o).

A significant decrease in the net magnetization of the $^1H_f$ resonance was observed over a wide range of irradiation frequencies ($\pm 50$ kHz) surrounding its resonance frequency. The effect of different irradiation frequencies, at constant power (0.4 watts), is shown in FIG. 2b. The linewidth of the irradiation effect was approximately 40 kHz and symmetrically centered around the $^1H_f$ resonance in the rabbit kidney (cf. FIG. 2b) and skeletal muscle in vivo (not shown) as well as in canine heart muscle in vitro (FIG. 2c).

No magnetization transfer was observed in distilled water (FIG. 2b), manganese doped water samples (to mimic in vivo $T_2$ values) or rabbit urine samples (not shown). The bandwidth (in Hz) of this effect was found to be independent of magnetic field strength (4.7 and 2 Tesla) in canine heart muscle in vitro (FIG. 2c) and was equivalent to that found in 3% agar solutions (not shown). The field independence of the line width suggests that the restricted motion of this $^1H_r$ pool approaches the rigid-lattice condition (correlation time $> 10^{-7}$ s$^{-1}$.

In FIG. 2b, spectra were collected with a $\pi/8$-acquire pulse sequence with no echo in this case. Preirradiation power was 0.4 watts. Field strength was 4.7 T. The in vivo kidney was the same preparation as described in FIG. 1. The distilled water sample (25° C.) in a glass tube was placed in the same coil used to collect the kidney data. The $^1H_f$ resonance frequency is at 0 Hz. Only data collected with the irradiation $>5$ kHz off of the $^1H_f$ resonance are reported in order to minimize the effects of radiofrequency "bleed over".

Figure 2C:
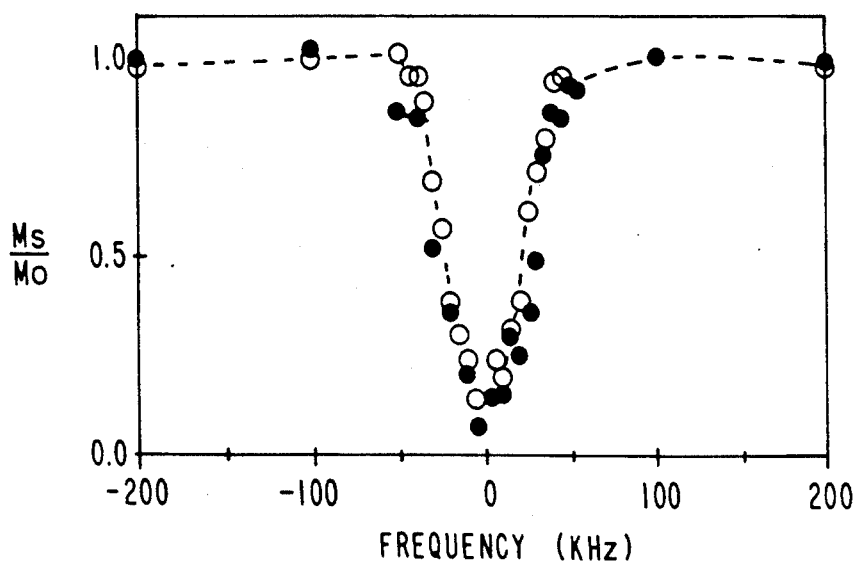
FIG. 2c shows the effect of preirradiation frequency on the magnitude of the $^1H_f$ resonance of canine cardiac tissues at two field strengths.

In FIG. 2c, approximately 2 grams of excised canine left ventricle muscle was placed in a glass tube and inserted into an NMR probe which could be tuned to the Larmor frequency of $^1H$ at the two fields. The temperature of these samples was 25° C. Spectra were collected as described in FIG. 2a .-ex vivo myocardium at 2.0 T. o-same tissue at 4.7 T.

The effect of non-specific radio-frequency "bleed over" from an irradiation is usually controlled for by irradiating frequencies on either side of a specific resonance to look for frequency specific effects. Since the $^1H_r$ component is symmetrical around $^1H_f$, as shown in FIGS. 2b and 2c, such controls are not possible in these experiments. However, the radiofrequency "bleed" from the off-resonance irradiation can be determined using the following equation:

$$M_s = M_o (1 + T_2^2 \omega^2)/(1 + T_2^2 \omega^2 + \gamma^2 H_1^2 T_{1f} T_{2f}) \qquad (1)$$

where $\omega$ is the offset frequency in Hz, $\Gamma$ is the gyromagnetic ration, and $H_1$ is the magnetic field (Tesla) induced by the irradiation. For this calculation, it is assumed that the irradiation time is on the order of $T_{1f}$. The $H_1$ fields were estimated by determining the time required to produce a 360° flip by the decoupler at the power levels used in this study. The $H_1$ field varied from $7.0 \times 10^{-6}$ Tesla (0.4 watts) to $3.5 \times 10^{-5}$ Tesla (8 watts) in the kidney coil and $6 \times 10^{-6}$ Tesla (0.75 watts) to $1.6 \times 10^{-5}$ Tesla (4.4 watts) in the leg coil. Using an irradiation strength of $7 \times 10^{-6}$ Tesla at 5 kHz (which was used for the rate constant calculations in this study), a $T_{2f}$ of 60 msec determined from spin-echo experiments and a $T_{1f}$ of 1.5 seconds (cf. Table 1), the bleed over of radio frequency energy would only result in a <8% decrease in the $^1H_f$ resonance of the kidney. Thus, the irradiation effects observed can only be minimally influenced by radiofrequency "bleed over". The $T_2$ of $^1H_r$ ($T_{2r}$) can be estimated from the frequency plot shown in FIGS. 2ba and 2c using equation 1, which can be used to define the frequency response of the irradiation as a function of power, $T_1$ and $T_2$. The irradiation $H_1$ field was $7 \times 10^{-6}$ Tesla and a $T_{1r}$ of one second was assumed (based on the estimated correlation time of this dipolar spin). This resulted in a calculated $T_{2r}$ of 0.2 msec, assuming that the $H_1$ field was uniform as a function of frequency with these rather low Q (~90) loaded coils.

TABLE 1

| | EFFECT OF $^1H_r$ SATURATION in vivo | | | | | |
|---|---|---|---|---|---|---|
| Tissue | $T_{1f{\rm obs}}$ (s) | $T_{1f{\rm sat}}$ (s) | $M_s/M_o$ | $T_{1f}$ (s$^{-1}$) | $K_a$ (s$^{-1}$) | N |
| Kidney | 1.5 ± 0.05 | 0.62 ± 0.08 | 0.30 ± .03 | 2.0 ± 0.2 | 4.0 ± 0.5 | 4 |
| Skeletal Muscle | 1.5 ± 0.02 | 0.30 ± 0.03 | 0.07 ± 0.005 | 4.5 ± 0.5 | 49.7 ± 4.0 | 4 |

The $T_1$ of the $^1H_f$ pool in the absence of exchange ($T_{1f}$) can be determined from the effect of $^1$ irradiation on the observed $T_1$ of the $^1H_f$ pool ($T_{1sat}$ and the steady state $^1H_f$ magnetization before ($M_o$) an after ($M_s$) irradiation according to the following equation for an inversion recovery experiment:

$$T_{1f} = M_o/M_s \times T_{1sat} \quad (2)$$

without $M_o$ is the $^1H_f$ steady state magnetizat without irradiation and $M_s$ is with irradiation of $^1H_r$. It should be noted that $T_{1f}$ will still be influenced other $T_1$ relaxation mechanisms, such as exchange with pools not irradiated and/or paramagnetic relaxation. evaluate the effect of $^1H_r$ irradiation on the observe $T_1$ of $^1H_f$, inversion recovery experiments were conduc in the presence and absence of irradiation on the $^1H_r$ pool. With a 0.4 watt irradiation 5 kHz from the $^1H_f$ resonance, the $T_1$ changed from ~1.5 second without irradiation to ~0.62 second. This observed decrease the $T_1$ of $^1H_f$ with irradiation of $^1H_r$ is also consist with the exchange of magnetization between these two pools. Using equation 2, the $T_{1f}$ values of whole kid and rabbit skeletal muscle were calculated and are presented in Table 1.

The $T_{1f}$ of the kidney (~2 seconds) is much shorter than skeletal muscle (~4.5 seconds), implying that a $T_1$ relaxation mechanism other than magnetizati exchange with the $^1H_r$ pool affects the $^1H_f$ pool in kidney. Likely candidates for this additional relaxation effect in kidney are paramagnetic metals, such as manganese, which are ten time higher in concentration in kidney than in skeletal muscle.

The apparent pseudo first order rate consta for the movement of magnetization from $^1H_f$ to $^1H_r$ can estimated from the effects of irradiation $^1H_r$ on the $^1H_f$ pool $T_1$ and steady state magnetization using the following equation:

$$k_a = 1/T_{1sat} [1 - M_s/M_o] \quad (3)$$

wherein $k_a$ is the apparent pseudo first order rate constant of magnetization transfer from $^1H_f$ to $^1H_r$. Table 1 lists the calculated $k_a$ values for rabbit skeletal muscle and kidney in vivo using equation 3. The higher rate constant in skeletal muscle may be due to a higher protein content and/or a more efficient exchange mechanism in this tissue.

The values presented in Table 1 represent the average exchange occurring over the whole tissue studied. To investigate whether or not this magnetization exchange between $^1H_f$ and $^1H_r$ is homogeneous throughout tissues, the effect of $^1H_r$ irradiation on the distribution of steady state $^1H$ magnetization was evaluated using NMR $^1H$ imaging. Since the conventional NMR imaging experiment requires the collection of an echo, these techniques generally detect only the $^1H_f$ pool because of its relatively long $T_2$.

Figure 3A:
FIG. 3A, 3B, 3C and 3D show the transverse spin warp $^1H$ NMR images of rabbit kidney in vivo.
Figure 3B:
Figure 3C:
Figure 3D:

NMR images of the kidney in vivo were taken using a conventional spin-warp sequence with and without irradiation 10 kHz from $^1H_f$ resonance. The images presented in FIGS. 3a-3b were collected with a 4.2 second recycle time (TR) and 20 mseconds echo time (TE) to minimize $T_1$ and $T_2$ contrast effects. FIG. 3a is the control image without irradiation, and FIG. 3b is with irradiation. FIG. 3c is the ratio of irradiated image to the control image (i.e., an $M_s/M_o$ image). To obtain an actual $k_a$ image, the $T_{1sat}$ of each voxel would have to be determined. The intensity of the renal cortex of the kidney was reduced by the irradiation to a much greater extent than the inner medulla resulting in improved contrast between these regions in the irradiated image (FIG. 3b) as well as the ratio image (FIG. 3c). This suggests that the exchange rate in the cortex of the kidney is higher than the inner medulla. The urine, blood vessels and fat were not significantly affected by the irradiation resulting in a very high intensity signal from these structures in the irradiated (FIG. 3b) and ratio (FIG. 3c) image. The lack of effect on urine presumably is due to the limited number of macromolecules in urine, resulting in limited magnetization exchange between a $^1H_r$ and $^1H_f$ pool. Blood $^1H_f$ was less affected by irradiation, since the flow of blood results in $^1H$ spins entering the field of view which were not irradiated if they came from a region outside of the coil. Furthermore, the irradiation of $^1H_r$ in whole rabbit blood (hematocrit 43%) in vitro resulted in a decrease in $^1H_f$ which was ~2 fold less than the whole kidney, indicating that the $^1H_f$-$^1H_r$ exchange is relatively slow in blood. The fat was unaffected, since this resonance does not exchange with the $^1H_r$ component (FIG. 1),. These results demonstrate that the magnitude of the irradiation effect on $^1H_f$ is tissue specific and causes tissue contrast in the NMR image based on the exchange process as well as flow from regions not affected by the irradiation.

In FIG. 3, the rabbit kidney preparation was as previously described. A) $^1H$ density image, TR=4.2 seconds, TE=20 mseconds, Field of view =40×40×3 mm, digital matrix size 128×128. B) Image collected using the same parameters as above, but with 3.5 seconds of 0.4 watt irradiation 5 kHz below the resonance frequency of $^1H$ occurring just before slice selection. C)

ratio image of image B divided by image A ($M_s/M_o$ image). D) $T_2$ weighted kidney image. Collection conditions were the same as in (A) only an 80 msecond TE was used to generate $T_2$ contrast.

The data described above demonstrate that the $^1H_f$ pool exchanges magnetization with an immobilized $^1H_r$ pool. Based on the present data, it is not possible to establish what portion of this exchange is due to a chemical exchange of protons or a through space interaction with immobilized water and/or macromolecules. Preliminary studies with natural abundance or isotopically enriched $^2H$ water signals in rabbit skeletal muscle in vivo reveal that no saturation transfer is observed with a broad component using similar conditions as outlined for $^1H$. This implies that the dipolar cross-relaxation may be the dominant factor in the saturation transfer observed with $^1H$. However, the quadrupolar relaxation of $^2H$ could results in such a broad line for the immobilized water that it could not be effectively saturated in these protocols and/or the relaxation processes could simply be dominated by the quadrupolar relaxation process.

Independent of mechanism, the exchange between the $^1H_f$ and $^1H_r$ pools result in the observed $^1H_f$ relaxation times (i.e., both $T_1$ and $T_2$) to be affected by the relaxation times of the $^1H_r$ pool according to the following equation:

$$1/T_{fobs} = 1/T_f + X_r/(T_r + 1/k_r) \quad (4)$$

where $T_{fobs}$ is the observed $T_1$ or $T_2$ of the $^1H_f$ pools. $T_f$ is the $T_1$ or $T_2$ of the $^1H_f$ pool in the absence of exchange, $X_r$ is the mole fraction of the $^1H_r$ pool, $T_r$ is the $T_1$ or $T_2$ of the $^1H_r$ pool in the absence of exchange, and $k_r$ is the rate constant of the transfer of magnetization from the $^1H_r$ to the $^1H_f$ pool. This equation is valid only when the two exchanging pools have the same chemical shift (cf. FIG. 2b) and $X_r$ is less than 0.3. With the $^1H_r$ pool effectively at the rigid lattice condition, the $T_2$ of this component will be much shorter than $T_1$. Thus, according to equation 4, it would be expected that the effect of the magnetization exchange would be much more pronounced for the observed $T_2$ of the $^1H_f$ pool than its $T_1$. Indeed, the $M_s/M_o$ images obtained for the rabbit kidney (FIG. 3c) and cat head (not shown) correlate with conventional $T_2$ weighted images (cf. FIG. 3d/0 and not $T_1$ weighted images with regard to overall tissue contrast patterns. This latter result suggests that the pathway of relaxation through $^1H_r$ is very significant in determining the observed $T_2$ in these tissues.

The imaging technique described generates tissue contrast based on the extent of magnetization transfer occurring in the tissues (i.e., magnetization transfer contrast, MTC). This contrast is very similar, on a gross level, to $T_2$ contrast, though it can be obtained without long echo times. High contrast images have been obtained using a gradient recalled echo sequences (5 msecond TE) using this approach.

The above demonstrates in a variety of biological tissues that the free water component of the $^1H$ NMR signal is in magnetization exchange with a relatively immobile component. The pseudo-first order rate constant of this exchange varied from 0 to ~4 s$^{-1}$, depending upon the particular tissue or fluid type. The exchange mechanisms could include chemical exchange and/or cross-relaxation processes between the free water $^1H$ and $^1H$ in or associated with large cellular macromolecules (proteins, membranes, etc.). The magnitude of this exchange process was imaged in tissue and provided a unique quantitative form of contrast for NMR imaging. Since the image contrast generated using this method is specific for the exchange between $^1H_f$ and $^1H_r$, this technique is valuable in diagnosis or characterization of cancer, edema, and other pathologies where the specific relaxation mechanisms is useful in determining the nature of the disease.

The foregoing description of the specific embodiments will so fully reveal the general nature of the invention that others can, by applying current knowledge, readily modify and/or adapt for various applications such specific embodiments without departing from the generic concept, and therefore such adaptations and modifications are intended to be comprehended within the meaning and range of equivalents of the disclosed embodiments. It is to be understood that the phraseology or terminology herein is for the purpose of description and not of limitation.

What is claimed is:

1. A method for obtaining spatial information about the rate of exchange of a reaction using the technique of saturation transfer by collecting NMR data from a sample in which the reaction occurs comprising:
   irradiating a first pool of nuclei with sufficient electromagnetic radiation to magnetically label said nuclei;
   electromagnetically exciting a second pool of nuclei that is in exchange with said first pool;
   applying magnetic field gradients to spatially resolve the NMR signal intensity of said second pool of nuclei;
   collecting and reading NMR data obtained from said signal; and
   determining said spatial information about said reaction.

2. The method of claim 1 wherein said first pool of nuclei is in smaller concentration than said second pool of nuclei.

3. The method of claim 1 wherein the data obtained from said method is ratioed with a conventional NMR image to obtain a ratio image.

4. The method of claim 3 wherein said ratio image is combined with spin-lattice relaxation data to obtain a rate constant image for the reaction.

5. The method of claim 1 wherein NMR data is collected from a nucleus selected from the group consisting of $^1H$, $^{31}P$, $^{13}C$, $^{23}Na$, $^{19}F$, $^2H$, $^{17}O$, $^{15}O$, $^7Li$, $^{14}N$, $^{15}N$, $^{39}K$, and $^{35}Cl$.

6. The method of claim 1 wherein the exchange is enzymatically catalyzed.

7. The method of claim 6 wherein the enzyme is creatine kinase.

8. The method of claim 1 wherein the first pool of nuclei is the gamma-phosphorus of ATP and the second pool of nuclei is the phosphorous in phosphocreatine.

9. The method of claim 1 Wherein the second pool of nuclei comprises protons in water.

10. The method of claim 1 wherein the exchange reaction involves labile protons of a compound in exchange with protons of the solution in which the compound is dissolved.

11. The method of claim 10 wherein the solvent is water.

12. The method of claim 1 wherein the first pool of nuclei is selected from the group consisting of protons of urea, protons of creatine, and protons of ammonia.

13. The method of claim 1 wherein the sample is of biological origin.

14. The method of claim 1 wherein the sample is of geologic origin.

15. The method of claim 1 wherein the sample is a polymer.

16. The method of claim 1 wherein the NMR data is spatially resolved.

17. The method of claim 1 wherein the rate of exchange is measured.

18. A method for determining the rate of exchange of a proton magnetization between a macromolecule and a solvent by collecting NMR data from a sample in which said exchange occurs comprising:
   irradiating a first a macromolecule with sufficient electromagnetic radiation to magnetically label said nuclei;
   and electromagnetically excite the nuclei that is exchanging proton magnetization with said macromolecule;
   collecting and reading NMR data obtained from said signal; and
   determining the presence of said exchange.

19. The method of claim 18 wherein said macromolecule of nuclei is in smaller concentration than said solvent nuclei.

20. The method of claim 18 wherein the solvent is wtaer.

21. The method of claim 18 wherein magnetic field gradients are applied to spatially resolve the NMR signal intensity of the solvent to reveal the spatial distribution of said exchange.

22. The method of claim 18 wherein the exchange rate is determined.

23. The method of claim 18 wherein the macromolecule is of biological origin.

24. The method of claim 18 wherein the macromolecule is of geologic origin.

25. The method of claim 18 wherein the macromolecule is a polymer.

26. The method of claim 18 wherein the macromolecule is a protein, lipid, saccharide or combined molecule.

27. The method of claim 26 wherein the second pool of nuclei comprises nuclei contained in a solvent.

28. The method of claim 18 wherein the data obtained from said method is ratioed with a conventional NMR image to obtain a ratio image.

29. The method of claim 18 wherein said ratio image is combined with spin-lattice relaxation data to obtain a rate constant image for the exchange of proton magnetization.

30. the method of claim 18 wherein said saturation transfer occurs via chemical exchange or dipolar interaction.

* * * * *

REEXAMINATION CERTIFICATE (3916th)

United States Patent [19]
Balaban et al.

[11] B1 5,050,609
[45] Certificate Issued Nov. 2, 1999

[54] MAGNETIZATION TRANSFER CONTRAST AND PROTON RELAXATION AND USE THEREOF IN MAGNETIC RESONANCE IMAGING

[75] Inventors: Robert S. Balaban, Bethesda, Md.; Steven D. Wolff, Durham, N.C.

[73] Assignee: The United States of America as represented by the Department of Health and Human Services, Washington, D.C.

Reexamination Request:
No. 90/005,113, Sep. 22, 1998

Reexamination Certificate for:
Patent No.: 5,050,609
Issued: Sep. 24, 1991
Appl. No.: 07/337,980
Filed: Apr. 14, 1989

Related U.S. Application Data

[63] Continuation-in-part of application No. 07/109,242, Oct. 14, 1987, abandoned.

[51] Int. Cl.[6] .................................................. A61B 5/055

[52] U.S. Cl. .................................................. 600/410

[56] References Cited

PUBLICATIONS

Saturation and Inversion Transfer Studies of Creatine Kinase Kinetics in Rabbit Skeletal Muscle in Vivo by Paul S. Hsieh and Robert S. Balaban, Magnetic Resonance in Medicine, vol. 7, pp. 56–64 (May 1988).

Muller et al., "True 3–D Imaging of Limbs by NMR Zeumatography with Off–Resonance Irradiation," *Europ. J. Radiol.* 3, pp. 286–290 (1983).

Lauterbur et al., "N.M.R. Zeumatography: A New and Practical Method of Contrast Enhancement," published abstract of the Annual Meeting of the GERM (Groupe d'Etudes de Résonance Magnétique), Mar. 1982.

*Primary Examiner*—Ruth S. Smith

[57] ABSTRACT

A nuclear magnetic resonance method is provided for monitoring and imaging the exchange of magnetization between protons in free water and protons in a relatively immobilized pool of protons in a sample. The method provides a new form of contrast for nuclear magnetic resonance imaging of samples such as biological tissues, polymers, and geological samples.

REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

The patentability of claims 1–30 is confirmed.

New claims 31–37 are added and determined to be patentable.

*31. A method of improving contrast in a magnetic resonance image by using a magnetization transfer technique, comprising the steps of:*

*providing a first pool of protons with a second pool of protons in magnetic exchange with the first pool;*

*applying a preparatory radiofrequency pulse sufficient to magnetically label the first pool with electromagnetic radiation, with minimal radiofrequency bleed over to the second pool, to allow transfer of magnetization from the first pool to the second pool;*

*obtaining magnetic resonance data that measure the effect of the transfer of magnetization from the first pool to the second pool; and*

*creating said magnetic resonance image using the magnetic resonance data.*

*32. The method of claim 31, wherein the radiofrequency bleed over to the second pool produces less than an 8% decrease in a $^1H_f$ resonance of the second pool as determined by the equation: $M_s = M_o(1 + T_{2f}^2 \omega^2)/(1 + T_{2f}^2 \omega^2 + \gamma^2 H_1^2 T_{1f} T_{2f})$.*

*33. The method of claim 31, wherein the radiofrequency pulse has a frequency that is offset from the resonant frequency of the second pool of protons.*

*34. The method of claim 31, wherein the radiofrequency pulse has a frequency that is offset form the resonant frequency of water protons.*

*35. The method of claim 34, wherein the frequency offset is about 0–200 kHz from the resonant frequency of water protons.*

*36. The method of claim 31, wherein the first pool includes protons that are bound within macromolecules.*

*37. The method of claim 31, wherein the second pool of protons comprises water protons.*

\* \* \* \* \*